United States Patent
Zhang et al.

(10) Patent No.: US 9,923,577 B1
(45) Date of Patent: Mar. 20, 2018

(54) HYBRID SOFTWARE-HARDWARE IMPLEMENTATION OF LOSSLESS DATA COMPRESSION AND DECOMPRESSION

(71) Applicant: ScaleFlux, Inc., San Jose, CA (US)

(72) Inventors: Tong Zhang, Albany, NY (US); Yang Liu, Milpitas, CA (US); Fei Sun, Irvine, CA (US); Hao Zhong, Los Gatos, CA (US)

(73) Assignee: SCALEFLUX, INC., San Jose, CA (US)

( * ) Notice: Subject to any disclaimer, the term of this patent is extended or adjusted under 35 U.S.C. 154(b) by 0 days.

(21) Appl. No.: 15/687,972

(22) Filed: Aug. 28, 2017

Related U.S. Application Data

(60) Provisional application No. 62/383,476, filed on Sep. 4, 2016.

(51) Int. Cl.
  *H03M 7/30* (2006.01)
  *H03M 7/40* (2006.01)
  *G06F 17/30* (2006.01)

(52) U.S. Cl.
  CPC .... *H03M 7/6017* (2013.01); *G06F 17/30979* (2013.01); *H03M 7/3084* (2013.01); *H03M 7/40* (2013.01)

(58) Field of Classification Search
  None
  See application file for complete search history.

(56) References Cited

U.S. PATENT DOCUMENTS

| | | | | |
|---|---|---|---|---|
| 7,051,126 B1* | 5/2006 | Franklin | ............... | G06F 13/122 709/247 |
| 8,806,292 B2* | 8/2014 | Biran | ...................... | H03M 7/30 341/65 |
| 9,419,647 B2* | 8/2016 | Gopal | ..................... | H03M 7/40 |

OTHER PUBLICATIONS

Ms. D M Kate, Hardware Implementation of the Huffman Encoder For Data Compression Using Altera DE2 Board, International Journal of Advances in Engineering Sciences, vol. 2 No. 2, Apr. 2012, RG Education Society (India).*

* cited by examiner

*Primary Examiner* — Howard Williams
(74) *Attorney, Agent, or Firm* — Hoffman Warnick LLC

(57) ABSTRACT

A system, method and product for providing data compression and decompression. A method is disclosed that includes: utilizing a CPU to perform a matching-bytes search, byte-oriented search result coding, and content analysis on a set of raw data to generate a set of initially compressed data; forwarding the set of initially compressed data from the CPU to a hardware accelerator; utilizing the hardware accelerator to perform search result re-coding, table construction, and encoding to generate a set of further compressed data; and forwarding the set of further compressed data back to the CPU.

20 Claims, 3 Drawing Sheets

HYBRID SOFTWARE-HARDWARE IMPLEMENTATION OF LOSSLESS DATA COMPRESSION AND DECOMPRESSION

PRIORITY CLAIM

This application claims priority to co-pending provisional application 62/383,476 filed on Sep. 4, 2016 entitled "Hybrid Software-Hardware Implementation of Lossless Data Compression and Decompression," the contents of which is hereby incorporated by reference.

TECHNICAL FIELD

The present invention relates to the field of data compression, and particularly to improving efficiency and throughput of implementing lossless data compression/decompression in various computing, communication, and data storage systems.

BACKGROUND

Lossless data compression is being pervasively used in data storage and communication systems to reduce the cost and/or improve speed performance. A large number of lossless data compression algorithms exist today, spanning a wide spectrum on the trade-off between data compression ratio and data processing complexity. A higher data processing complexity tends to cause slower compression/decompression throughput. The most well-known and widely used lossless compression algorithm is DEFLATE, which is used to generate/decompress GZIP, ZIP, and PNG files. In spite of its relatively good compression ratio, implementing DEFLATE on a central processing unit (CPU) suffers from low throughput, e.g., tens of MB/s compression, which is significantly inadequate for many real-life applications. As a result, a number of high-speed compression algorithms have been developed, most notably Snappy and lz4 algorithms. These algorithms can achieve 10× higher compression throughput on the CPU compared with DEFLATE, at the cost of worse compression ratio. There have been prior efforts that speed-up the DEFLATE algorithm by off-loading the processing into a dedicated hardware accelerator, e.g., an ASIC (application specific integrated circuit) or FPGA (field programmable gate array) chip which is connected to the CPU through interfaces such as PCIe.

Conventional practice off-loads the entire DEFLATE algorithm to the accelerator, which leads to two drawbacks. Firstly, the CPU has to send/receive the original raw data to/from the accelerator through interfaces such as PCIe for compression/decompression. As a result, the achievable compression/decompression throughput is limited by the interface bandwidth, even if the accelerator itself could compress/decompress data at much higher throughput. Secondly, DEFLATE compression/decompression consumes significant silicon resources on the accelerator, in particular for FPGA-based accelerators, leading to a higher implementation cost.

SUMMARY

Accordingly, an embodiment of the present disclosure is directed to a system and method for improving the efficiency and throughput in the realization of lossless data compression and decompression.

In a first aspect, the invention provides a method for compressing data, comprising: utilizing a CPU to perform a matching-bytes search, byte-oriented search result coding, and content analysis on a set of raw data to generate a set of initially compressed data; forwarding the set of initially compressed data from the CPU to a hardware accelerator; utilizing the hardware accelerator to perform search result re-coding, table construction, and encoding to generate a set of further compressed data; and forwarding the set of further compressed data back to the CPU.

In a second aspect, the invention provides a system for compressing data, comprising: a CPU having a processor, memory and software code to perform a matching-bytes search, byte-oriented search result coding, and content analysis on a set of raw data to generate a set of initially compressed data; a hardware accelerator having a processing core configured to perform search result re-coding, table construction, and encoding on the set of initially compressed data to generate a set of further compressed data; and an interface configured to communicate the set of initially compressed data from the CPU to the hardware accelerator and communicate the set of further compressed data from the hardware accelerator back to the CPU.

In a third aspect, the invention provides a data compression product, comprising: program code stored on a computer readable medium, which when executed by a CPU performs a matching-bytes search, byte-oriented search result coding, and content analysis on a set of raw data to generate a set of initially compressed data; and a hardware accelerator having a processing core configured receive the set of initially compressed data, perform search result re-coding, table construction, and encoding to generate a set of further compressed data.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

Figure 1:
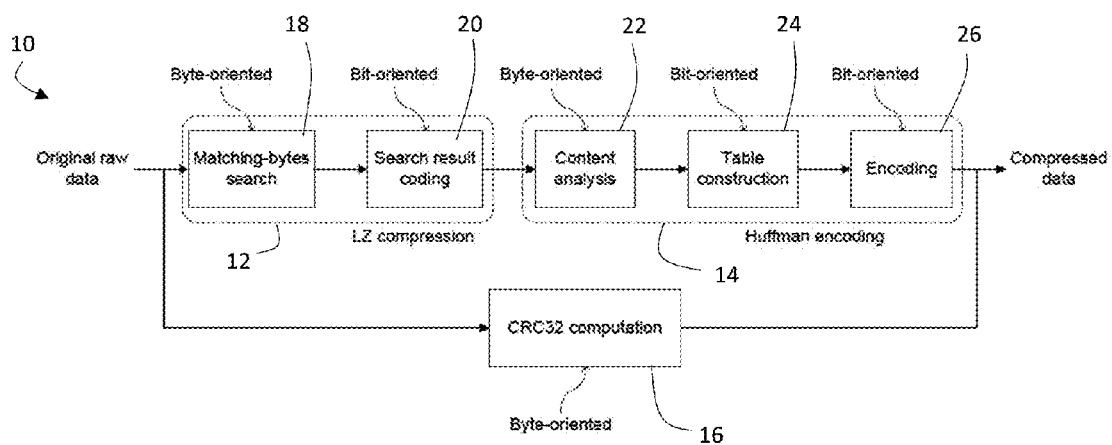
FIG. 1 illustrates the data flow of DEFLATE compression.

FIG. 1 depicts a process flow of DEFLATE lossless data compression 10, which includes three main processes: (1) LZ compression 12; (2) Huffman encoding 14; and (3) CRC32 parity computation 16. LZ compression 12 replaces repeated bytes with pointers to reduce the data size. Major operations in LZ compression 12 include (i) a matching-bytes search 18 that searches for repeated bytes in the raw data byte-steam, and (ii) search result coding 20, which uses specific rules to make the bit representation of matching results (i.e., pointers) more compact.

Huffman encoding 14 is one of the most widely used entropy coding techniques, and Huffman coding aims to compress data by using short-length symbols to represent more frequent content. Major operations in Huffman encoding include (i) content analysis 22 that collects the content occurrence statistics, (ii) table construction 24 that derives the appropriate Huffman code table based upon the collected statistics information, and (iii) encoding 26 that compresses the data using the Huffman code table. In essence, DEFLATE uses Huffman encoding to further compress the LZ-compressed data in order to maximize the compression efficiency.

CRC32 parity computation 16 computes the 4-byte CRC32 parity of the original raw data, and the 4-byte CRC32 parity is appended to the final compression output for error checking purposes.

The overall DEFLATE compression can be expressed as a ratio of the LZ compression 12 and the Huffman encoding 14. For example, let $R_{LZ}$ and $R_H$ denote the compression ratio of the LZ compression 12 and Huffman encoding 14, respectively, where the compression ratio is defined as the after-compression data size over the before-compression data size (i.e., the smaller the compression ratio is, the better the data are compressed). The overall DEFLATE compression ratio can be expressed as $R_{LZ} \cdot R_H$.

As noted, although a relatively good compression ratio is achievable, implementing DEFLATE on the CPU suffers from low throughput. To address this, the entire DEFLATE compression algorithm can be off-loaded from the CPU to an accelerator (e.g., an ASIC or FPGA chip). This reduces the load on the CPU, but nevertheless leads to two drawbacks. Firstly, the CPU has to send the original raw data to the accelerator through interfaces such as PCIe for compression. For instance, if $B_{int}$ denotes the interface bandwidth, the compression throughput is limited to $B_{int}$, regardless of the throughput the accelerator itself could achieve. Secondly, DEFLATE compression requires significant silicon resources on the accelerator, in particular for FPGA-based accelerators, leading to a high implementation cost.

The present approach addresses such drawbacks using a hybrid approach in which byte-oriented operations are performed on the CPU and bit-oriented operations are off-loaded to an accelerator. As shown in FIG. 1, between the two major operations involving LZ compression of DEFLATE, matching-bytes search 18 is a highly byte-oriented operation and can be most effectively performed by the CPU, while the search result coding 20 is a highly bit-oriented operation and hence does not well fit with normal CPU operations. (In existing high-speed compression algorithms such as Snappy and lz4, the search result coding 20 is modified to be byte-oriented in order to better fit with the CPU at the cost of compression ratio.) Among the three major operations in Huffman encoding 14, the first operation of collecting the content occurrence statistics (content analysis 22) is highly byte-oriented and hence can be efficiently performed by the CPU. The other two operations (i.e., Huffman code table construction 24 and encoding 26) are highly bit-oriented and hence do not well fit with CPU operations. Finally, the CRC32 parity computation 16 is a highly byte-oriented operation and hence can be efficiently performed by the CPU.

Figure 2:
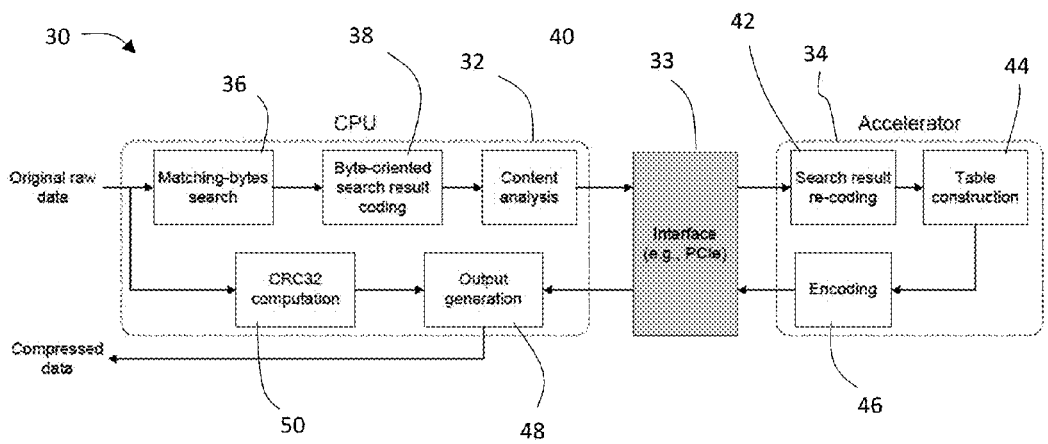
FIG. 2 illustrates a hybrid compression architecture/process according to embodiments of the present invention.

FIG. 2 shows the architecture of the present hybrid software-hardware implementation of lossless data compression. An aspect of this approach is to off-load bit-oriented operations (e.g., search result coding and Huffman encoding) to the accelerator 34 while keeping byte-oriented operations in the CPU 32. Compared with CPU operations, accelerators such as ASIC and FPGA chips can be appropriately customized at the circuit level to efficiently implement bit-oriented operations with very high parallelism. This can enable a much higher throughput of bit-oriented operations than CPU-based implementations, even though the CPU clock frequency (e.g., a few GHz) is typically 10× higher than that of an ASIC/FPGA (e.g., a few hundreds of MHz).

Conversely, any byte-oriented operations, especially matching-bytes search 36, are performed by the CPU 32, since the byte-processing nature and high clock frequency of the CPU 32 make it possible to realize these byte-oriented operations at very high throughput. As shown in FIG. 2, the CPU 32 carries out search result coding in a byte-oriented format (i.e., byte-oriented search result coding 38) to generate a set of initially compressed data, i.e., LZ compression output. The accelerator 32 then carries out the search result re-coding 42 to transform the research result encoded in byte-oriented format into a more compact bit-oriented format. For example, to compress data, matching-byte search 36 first searches for repeated byte-strings in the data (e.g., to compress the byte string 'abcdefgabcd', the 2nd 'abcd' can be replaced with a pointer to the 1st 'abcd'). To code the pointer, two pieces of information are used: (1) length (i.e., how many bytes does the replaced byte-string contain, e.g., the length is four in the above example), and (2) distance (i.e., how long is the pointer, e.g., the distance is seven in the above example from the 1st 'a' to the second 'a').

In the first stage (i.e., byte-oriented search result coding 38), both length and distance are coded in a byte-oriented manner, e.g., 2-bytes to represent each length and 2-bytes to represent each distance. Since CPU 32 can most efficiently handle data byte-by-byte, such a byte-oriented search result coding can be very easily realized by CPU 32 at a very high speed.

However, such a byte-oriented search result coding 38 is not optimal in terms of compression efficiency since different values of length and distance could occur at (very) different probabilities. Accordingly, search result re-coding 42 is implemented in the accelerator 42 to re-code the results into a bit-oriented format. Hence, using bit-oriented re-coding of search results to improve compression efficiency, instead of using 2-bytes for every possible value of length and distance, length/distances with a higher occurrence probability may be coded with less number of bits (e.g., 9-bit) while length/distances with a lower occurrence probability may be coded with a larger number of bits (e.g., 18-bit). For example, if a distance of seven has a high occurrence probability and it is coded as a 9-bit value '001100111', the re-coding operation transforms the original 2-byte coding of 7 (i.e., '0000000000000111') into a 9-bit coding (i.e., '001100111'). Since CPU 32 cannot efficiently handle such bit-oriented re-coding, the operation is off-loaded to accelerator 34.

In this embodiment, CPU 32 also carries out content analysis 32, CRC32 parity computation 50 and output generation 48. Content analysis 32, which is part of the Huffman encoding process, analyzes the byte-compressed data to provide data frequencies (i.e., how often different strings of data occur) and includes that analysis with the set of initially compressed data being passed to the accelerator 34. Accelerator 34 carries out the remaining Huffman encoding operations of table construction 44 and encoding 46 to generate a set of further compressed data which is passed back to CPU 32. CPU 32 then appends the CRC32 parity to the set of further compressed data and outputs a final set of compressed data (e.g., to CPU DRAM).

The hybrid architecture has various advantages. Namely, since the LZ compression is carried out mainly by CPU 32, the LZ-compressed data, instead of original raw data, are transferred from CPU 32 to the accelerator 34 via interface 33. Let $B_{int}$ denote the interface bandwidth, and $R_{LZ}$ denote the compression ratio of the LZ compression. The maximum achievable compression throughput is $B_{int}/R_{LZ}$, i.e., an increase of $1/R_{LZ}$ times compared with completely off-loading the entire compression to the accelerator 34. For highly compressible data with $R_{LZ}$ of around 0.25 and below, this leads to 4× and even beyond higher compression throughput. Furthermore, the hybrid architecture can fully exploit the fact that modern CPUs can very efficiently carry out those byte-oriented operations in software, in particular matching-bytes search 36. Hence it can minimize the implementation cost of the accelerator 34.

Figure 3:
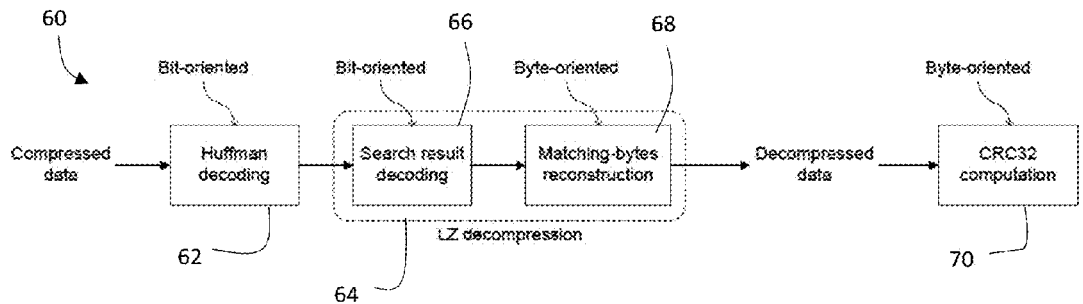
FIG. 3 illustrates the data flow of DEFLATE decompression.
Figure 4:
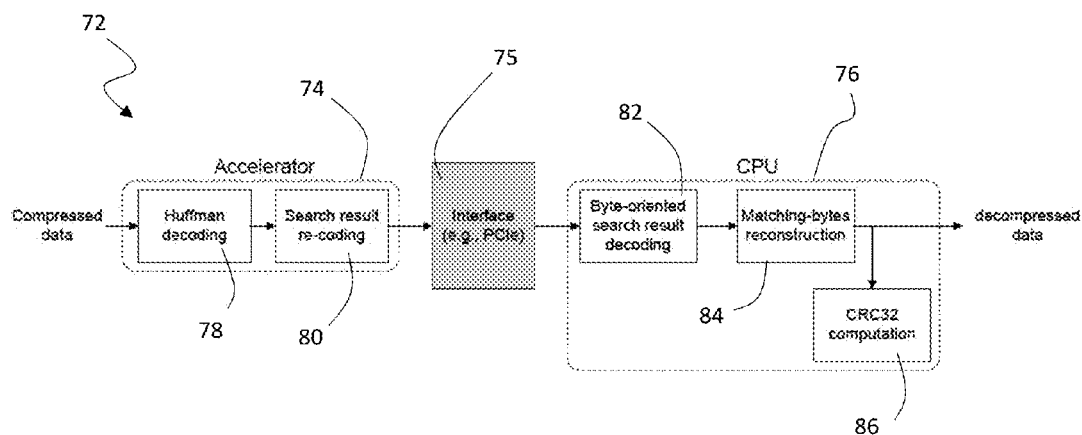
FIG. 4 illustrates a hybrid decompression architecture/process according to embodiments of the present invention.

FIGS. 3 and 4 describe a related decompression process. As shown in FIG. 3, traditional DEFLATE lossless data decompression 60 contains several steps, including Huffman decoding 62, LZ decompression 64 and CRC32 parity computation 70. Huffman decoding 62 is a reverse operation of Huffman encoding. Using the Huffman code table, which is either explicitly contained in the compressed data stream or is already pre-fixed, Huffman decoding 62 decodes (i.e., decompresses) the Huffman-encoded data stream. Huffman decoding 62 is a bit-oriented operation and can be most effectively implemented by customized hardware. LZ decompression 64 is a reverse operation of LZ compression. LZ decompression 64 interprets the pointers embedded in the LZ-compressed data stream to reconstruct the original data. Its two major operations include (i) search result decoding 66 that reconstructs the original matching-bytes search result, and (ii) matching-bytes reconstruction 68 that reconstructs the original data based upon the research result. In addition, compared with Huffman decoding that does not require any noticeable amount of buffer memory, LZ decompression 64 requires a buffer memory to hold previously decompressed data, and the typical size of the buffer memory is at least 32 kB or 64 kB. CRC32 parity computation 70 computes the 4-byte CRC32 parity of the decompressed data, which is compared against with the 4-byte CRC parity contained in the compressed data to check the data integrity.

FIG. 4 shows the architecture of the present hybrid software-hardware implementation of lossless data decompression 72. Similar to the compression system described above, the key idea is to off-load the bit-oriented operation Huffman decoding 78 into the accelerator 74, while the byte-oriented operation LZ decompression 82 and CRC32 computation 86 are performed by the CPU 76. In addition, the accelerator 74 re-codes the search result encoded in bit-oriented format into a byte-oriented format (search result re-coding 80) that can be used by CPU-based LZ decompression (match-bytes reconstruction 84). As shown, accelerator 74 first performs Huffman decoding 78 and search result re-coding 80 to generate a partially decompressed set of data, which is forwarded to CPU 76. CPU 76 then performs byte-oriented search result decoding 82 and matching-bytes reconstruction 84 to generate a set of fully decompressed data. CRC32 computation 86 is performed on the parity as an error checking measure.

Figure 5:
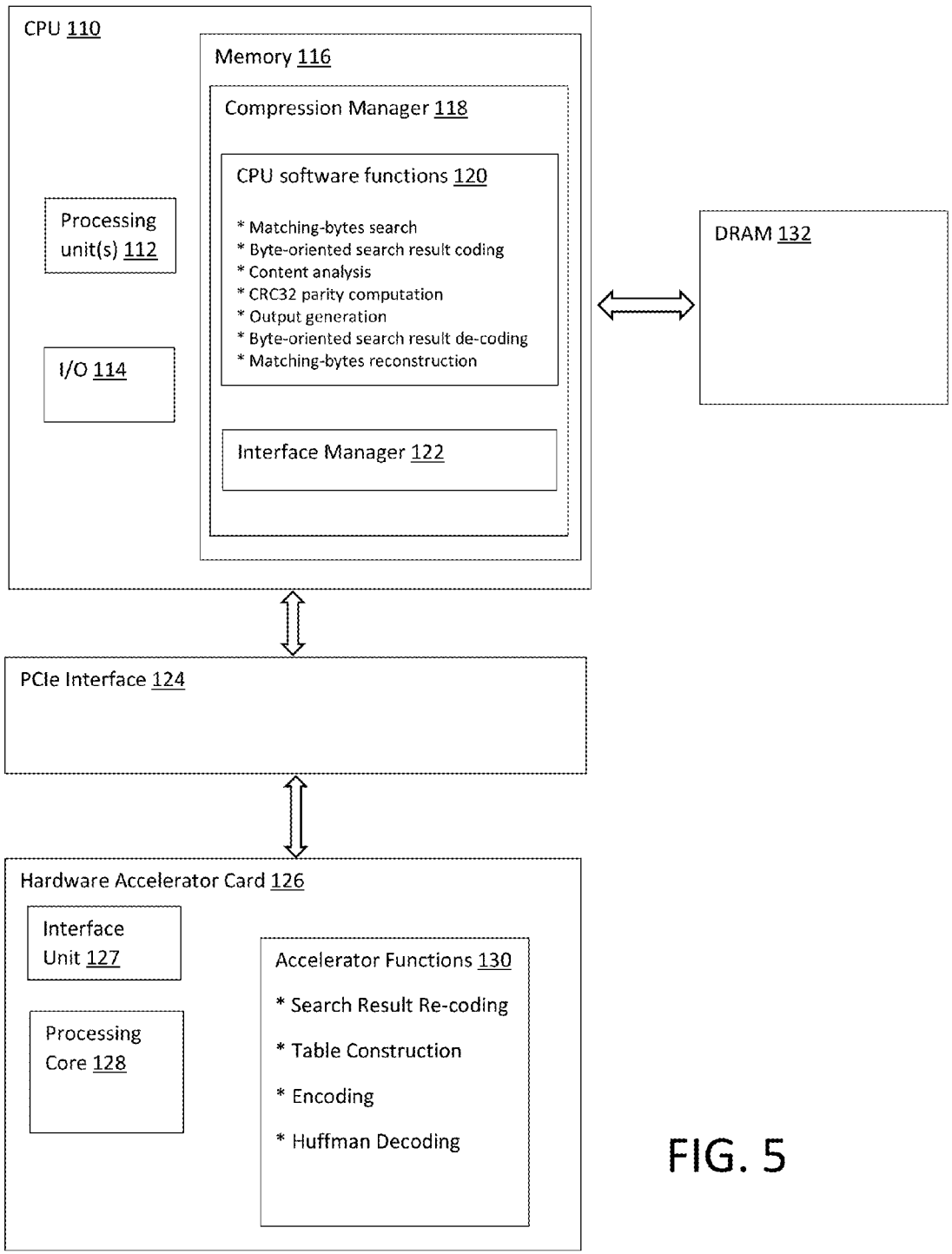
FIG. 5 depicts a system level example of a hybrid compression architecture according to embodiments of the present invention.

FIG. 5 depicts a computing system architecture for implementing the above described hybrid compression and decompression process. In this illustrative embodiment, a software based compression manager 118 is installed and executable from the CPU 110. Compression manager 118 is launched when data is required to be compressed or decompressed, and includes logic for controlling which functions are to be performed by CPU software functions 120 and which are to be performed by accelerator functions 130 that reside in a hardware accelerator card 126. For example, during data compression, matching bytes search, byte-oriented search result coding and content analysis may be performed by the CPU 110 along a first processing thread and CRC parity computation is performed along a second processing thread (as shown in FIG. 2). The set of initially compressed data generated from the first thread is directed to the hardware accelerator card 126, e.g., by interface manager 122 via PCIe interface 124. An interface unit 127 on the hardware accelerator card 126 reads in the set of initially compressed data and the processing core 128 performs search result recoding, table construction, and encoding. A set of further compressed data is then passed back to the CPU 100 by interface unit 127 via PCIe interface 124, and interface manager 122. Compression manager 118 then combines and outputs the results from the hardware accelerator card 126 and the CRC parity computation using the output generation function. The results are then, e.g., stored in DRAM 132.

It is understood that the compression manage 118 may be implemented as a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

CPU 110 that may comprise any type of computing device and for example includes at least one processing unit or processor 112, memory 116, an input/output (I/O) 114 (e.g., one or more I/O interfaces and/or devices), DRAM 132 and a communications pathway. In general, processor(s) 112 execute program code which is at least partially fixed in memory 116. While executing program code, processor(s) 112 can process data, which can result in reading and/or writing transformed data from/to memory and/or I/O 114 for further processing. The pathway provides a communications link between each of the components in CPU 110. I/O 114 can comprise one or more human I/O devices, which enable a user to interact with CPU 110. CPU 110 may also be implemented in a distributed manner such that different components reside in different physical locations.

Furthermore, it is understood that the compression manager 118 or relevant components thereof (such as an API component, agents, etc.) may also be automatically or semi-automatically deployed into a computer system by sending the components to a central server or a group of central servers. The components are then downloaded into a target computer that will execute the components. The components are then either detached to a directory or loaded into a directory that executes a program that detaches the components into a directory. Another alternative is to send the components directly to a directory on a client computer hard drive. When there are proxy servers, the process will select the proxy server code, determine on which computers to place the proxy servers' code, transmit the proxy server code, then install the proxy server code on the proxy computer. The components will be transmitted to the proxy server and then it will be stored on the proxy server.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method for compressing data, comprising:
utilizing a CPU to perform a matching-bytes search, byte-oriented search result coding, and content analysis on a set of raw data to generate a set of initially compressed data;
forwarding the set of initially compressed data from the CPU to a hardware accelerator;
utilizing the hardware accelerator to perform search result re-coding, table construction, and encoding to generate a set of further compressed data; and
forwarding the set of further compressed data back to the CPU.

2. The method of claim 1, further comprising:
performing a parity computation on the set of raw data to generate a parity of the original raw data at the CPU;

appending the parity to the set of further compressed data at the CPU; and outputting a final set of compressed data.

3. The method of claim 1, wherein the matching-bytes search and byte-oriented search result coding provides LZ compression on the set of raw data using a byte-oriented format.

4. The method of claim 3, wherein the search result re-coding re-codes the byte-oriented format into a bit-orient format.

5. The method of claim 4, wherein the content analysis, table construction and encoding comprise Huffman encoding operations.

6. The method of claim 1, wherein the hardware accelerator is one of an FPGA or ASIC device.

7. The method of claim 2, wherein the parity computation comprises a CRC32 parity computation.

8. A system for compressing data, comprising:
a CPU having a processor, memory and software code to perform a matching-bytes search, byte-oriented search result coding, and content analysis on a set of raw data to generate a set of initially compressed data;
a hardware accelerator having a processing core configured to perform search result re-coding, table construction, and encoding on the set of initially compressed data to generate a set of further compressed data; and
an interface configured to communicate the set of initially compressed data from the CPU to the hardware accelerator and communicate the set of further compressed data from the hardware accelerator back to the CPU.

9. The system of claim 8, further comprising software code on the CPU configured to:
perform a parity computation on the set of raw data to generate a parity of the original raw data;
append the parity to the set of further compressed data; and
output a final set of compressed data.

10. The system of claim 8, wherein the matching-bytes search and byte-oriented search result coding provides LZ compression on the set of raw data using a byte-oriented format.

11. The system of claim 10, wherein the search result re-coding re-codes the byte-oriented format into a bit-orient format.

12. The system of claim 11, wherein the content analysis, table construction and encoding comprise Huffman encoding operations.

13. The system of claim 8, wherein the hardware accelerator is one of a FPGA or ASIC device.

14. The system of claim 8, further comprising:
decompression functionality implemented on the hardware accelerator that provides Huffman decoding and search result re-coding to generate a partially decompressed set of data from a set of compressed data; and
decompression software code implemented on the CPU that provides byte-oriented search result decoding and matching-bytes reconstruction on the partially decompressed set of data to generate and output a fully decompressed set of data.

15. A data compression product, comprising:
program code stored on a computer readable medium, which when executed by a CPU performs a matching-bytes search, byte-oriented search result coding, and content analysis on a set of raw data to generate a set of initially compressed data; and
a hardware accelerator having a processing core configured receive the set of initially compressed data, perform search result re-coding, table construction, and encoding to generate a set of further compressed data.

16. The data compression product of claim 15, wherein the program code is further configured to:
perform a parity computation on the set of raw data to generate a parity of the original raw data;
receive the set of further compressed data from the hardware accelerator;
append the parity to the set of further compressed data; and
output a final set of compressed data.

17. The data compression product of claim 15, wherein the matching-bytes search and byte-oriented search result coding provides LZ compression on the set of raw data using a byte-oriented format.

18. The data compression product of claim 17, wherein the search result re-coding re-codes the byte-oriented format into a bit-orient format.

19. The data compression product of claim 15, wherein the content analysis, table construction and encoding comprise Huffman encoding operations.

20. The data compression product of claim 15, further comprising:
decompression functionality implemented on the hardware accelerator that provides Huffman decoding and search result re-coding to generate a partially decompressed set of data from a set of compressed data; and
decompression program code that provides byte-oriented search result decoding and matching-bytes reconstruction on the partially decompressed set of data to generate and output a fully decompressed set of data.

* * * * *